(12) United States Patent
Strulovici et al.

(10) Patent No.: US 9,218,894 B2
(45) Date of Patent: Dec. 22, 2015

(54) DEVICE AND METHOD FOR MEMORY REPAIR USING TEST LOGIC

(71) Applicant: BROADCOM CORPORATION, Irvine, CA (US)

(72) Inventors: Ilan Strulovici, Caesarea (IL); Yizhak Feldman, Ramat Gan (IL)

(73) Assignee: Broadcom Corporation, Irvine, CA (US)

( * ) Notice: Subject to any disclaimer, the term of this patent is extended or adjusted under 35 U.S.C. 154(b) by 252 days.

(21) Appl. No.: 13/963,831

(22) Filed: Aug. 9, 2013

(65) Prior Publication Data

US 2015/0029801 A1    Jan. 29, 2015

Related U.S. Application Data

(60) Provisional application No. 61/857,977, filed on Jul. 24, 2013.

(51) Int. Cl.
*G11C 7/00* (2006.01)
*G11C 29/44* (2006.01)
*G11C 29/00* (2006.01)

(52) U.S. Cl.
CPC .......... *G11C 29/4401* (2013.01); *G11C 29/785* (2013.01); *G11C 29/808* (2013.01); *G11C 29/846* (2013.01)

(58) Field of Classification Search
CPC ............. G11C 29/4401; G11C 29/808; G11C 29/785; G11C 29/846
USPC .......................... 365/200, 201, 225.7, 230.06
See application file for complete search history.

(56) References Cited

U.S. PATENT DOCUMENTS

2003/0206470 A1\* 11/2003 Leader et al. .................. 365/201
2008/0301507 A1\* 12/2008 Behera et al. .................. 714/718

\* cited by examiner

*Primary Examiner* — Richard Elms
*Assistant Examiner* — Mohammed A Bashar
(74) *Attorney, Agent, or Firm* — McDermott Will & Emery LLP (57) ABSTRACT

A device for repairing a memory device using a test-bypass register associated with the memory device may include a comparator configured to compare a current address of the memory device with a faulty address and to generate a match signal when the current address matches the faulty address. A logic block may be coupled to the comparator and configured to generate one or more output signals in response to the match signal. The faulty address may be associated with a non-operational cell of the memory device. The one or more output signals may be coupled to one or more memory-bypass inputs of the test-bypass register. The one or more output signals may be configured to enable use of the test-bypass register instead of the non-operational cell of the memory device.

20 Claims, 5 Drawing Sheets

DEVICE AND METHOD FOR MEMORY REPAIR USING TEST LOGIC

CROSS-REFERENCE TO RELATED APPLICATIONS

This application claims the benefit of priority under 35 U.S.C. §119 from U.S. Provisional Patent Application 61/857,977 filed Jul. 24, 2013, which is incorporated herein by reference in its entirety.

TECHNICAL FIELD

The present description relates generally to memory systems, and more particularly, but not exclusively, to a device and a method for memory repair using test logic.

BACKGROUND

Many memory devices such as mass storage memory devices may include a large number of memory cells, one or more of which may be initially defective due to non-ideal manufacturing processes, or may become defective during application due to degradation and wear out. The initial defective memory cells or blocks may be identified by the manufacturer and provided through the data sheet of the memory device. Many systems may keep track of bad memory cells or blocks during the life of the memory device and store a list of defective one or more faulty addresses associated with one or more bad memory cells or blocks.

Memory devices may include embedded built-in-self-test (BIST) engines that can facilitate testing of each memory device. In addition, test/scan logic may be used to test memory interfaces. The test/Scan logic may include a sampling stage between the data-in (DIN) and data-out (DOUT) ports of the memory device. The sampling stage may add observability of the memory interface during scan/test modes by entering the memory into a bypass mode, during which the memory is not accessible.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

The subject technology is directed to a device and a method for repairing memory using an existing test/scan logic. The repair may be performed at various stages, including an operational stage when the memory is being used. The subject device may be implemented without requiring a change in the memory circuit. The subject technology may enable repair of one or more faulty rows in memories, with minimal hardware addition, by re-using the existing test/scan logic and without a reset stage, and thus without requiring any memory device down-time. The repair performed by the disclosed solution is an in-field programmable repair. The disclosed solution can also support hard programmable repair (e.g., employing fuses or one-time programmable memory). Further, the disclosed technology may save chip area and power consumption while providing a programmable repair solution.

Figure 1A:
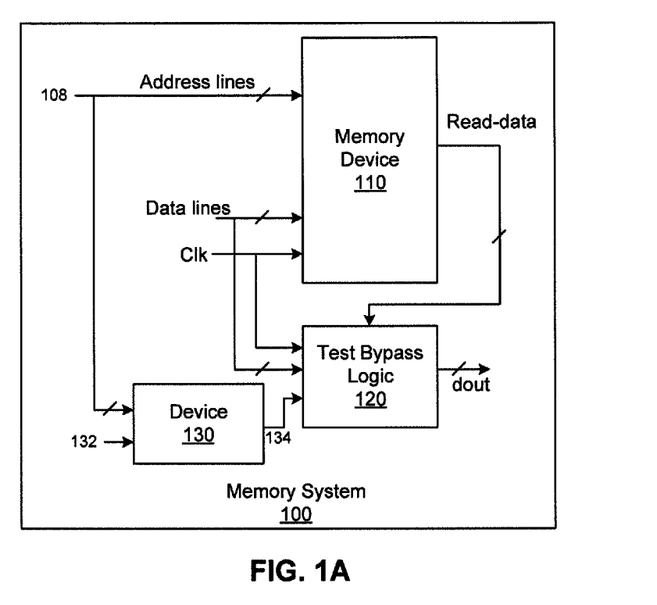
FIG. 1A illustrates an example of a memory system including a device for repairing a memory device using a test-bypass logic associated with the memory device in accordance with one or more implementations.

FIG. 1A illustrates an example of a memory system 100 including a device 130 for repairing a memory device 110 using a test-bypass logic 120 associated with the memory device in accordance with one or more implementations of the subject technology. The memory system 100 may include, but is not limited to, the memory device 110, the test-bypass logic 120, and the device 130. The memory system 100 may include other components such as an embedded built-in-self-test (BIST) engine that can facilitate testing of the memory device 110, and is not shown here since the subject solution does not use or affect the BIST engine. The memory device 110 may include a number of memory cells organized in several rows and columns. In one or more aspects, examples of the memory device may include single-port memory, dual-port memory, random-access memory (RAM), static RAM (SRAM), dynamic RAM (DRAM), and flash memory. One or more memory cells of the memory device 110 may be identified by the manufacturer or detected by the BIST engine or otherwise, as being non-operational (e.g., defective).

The disclosed solution may use the disclosed device 130 and the already existing test-bypass register 120 (e.g., e.g., test/scan logic) to repair the non-operational memory cell(s), while the memory system 100 is operational. The test-bypass logic 120 may be used by the memory system 100 to test memory interfaces (not shown here for simplicity). The test-bypass logic 120 may share the data input lines (e.g., data lines) and a clock signal ClK with the memory device 110. Read-data lines of the memory device 110 may be coupled to the test-bypass logic 120 and output data at dout lines of the test-bypass logic 120 may be used to provide data output of the memory device 110, as discussed in more detail herein.

In one or more implementations of the subject technology, the device 130 may compare a current address 108 loaded into the address lines of the memory device 110 with a faulty address 132 and generate a match signal when the current address 108 matches the faulty address 132. The faulty address 132 may be an address associated with a non-operational memory cell of the memory system 100. The device 130 may include logic circuits that can generate one or more output signals 134 in response to the match signal. The output signals 134 may be coupled to memory-bypass inputs of the test-bypass logic 120. The output signals 134 may be configured to enable use of the test-bypass logic 120 instead of the non-operational cell of the memory device, as described in greater detail herein.

Figure 1B:
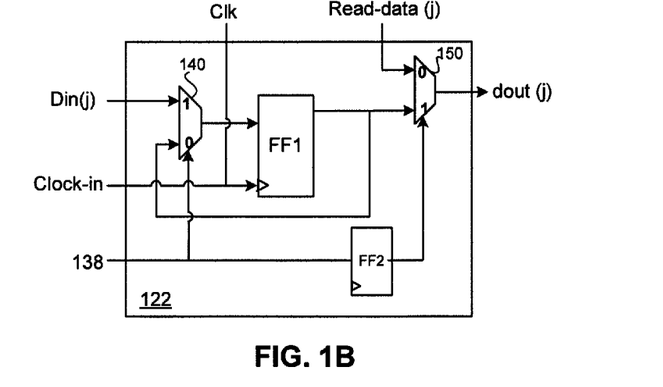
FIG. 1B illustrates an example of a test-bypass register of the test-bypass logic of FIG. 1A in accordance with one or more implementations.

FIG. 1B illustrates an example of a test-bypass register 122 of the test-bypass logic 120 of FIG. 1A in accordance with one or more implementations of the subject technology. The test-bypass register 122 may correspond to a data line (e.g., din (j) associated with a row) of the memory device 110 of FIG. 1A. In other words, the test-bypass register 122 may include multiple test-bypass registers 122 (not shown in FIG. 1B for simplicity), the number of which can be equal to the number of data lines of the memory device 110 (e.g., 32). In one or more embodiments, the test-bypass register 122 includes a first multiplexer 140, a first flip-flop FF1, a second multiplexer 150, and an optional second flip-flop FF2. The operation of the test-bypass register 122 may be controlled by a mem-bypass signal at the mem-bypass input 138 of the test-bypass register 122. The mem-bypass signal may control selections of one of the input signals of the first multiplexer 140 and the second multiplexer 150.

It is understood that the mem-bypass signal is asserted when the memory device 110 is in a test/scan mode. When the mem-bypass signal is asserted (e.g., is at logic high), the data bit at the din(j) input of the test-bypass register 122 is selected by the first multiplexer 140 and stored in the first flip-flop FF1. Further, as long as the mem-bypass signal is at the logic high, the asserted mem-bypass signal causes the second multiplexer 150 to select, as its output dout(j), the output data bit of the first flip-flop FF1, which is the data bit written to the flip-flop FF1, in parallel to the memory device 110. However, in the context of the present disclosure, the test-bypass register 122 may be used to perform a programmable repair of non-operation memory cell located in the memory row of the memory device 110 that is coupled to the data line din(j). In other words, the data input for the non-operational cell of the memory device 110 can be written into the first flip-flop FF1 and in parallel to one or more memory locations in memory device 110. The reading of the data, however, has to be from the first flip-flop FF1. This allows the first flip-flop FF1 to replace the non-operational memory cell of the memory device 110, as discussed in more detail herein. It should be noted, however, that in a typical application of the test-bypass logic 120 in the existing memory devices, when the memory system is in the test/scan mode, all data inputs can be written to the memory device and/or the flip-flops of the test-bypass registers 122. One of the advantages of the subject technology is that the same test-bypass logic 120 can be leveraged to repair the memory device 110 by bypassing the non-operational memory cells with the flip-flops of the test-bypass registers 122.

Figure 2A:
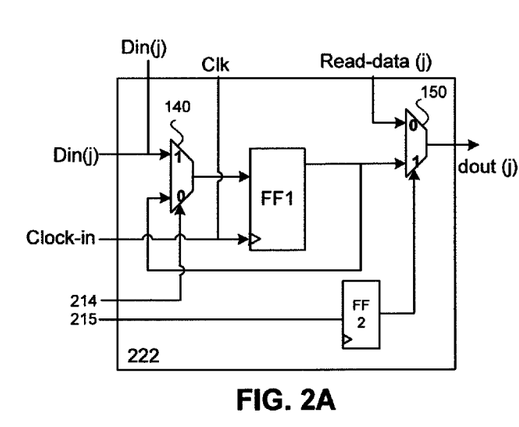
FIGS. 2A-2C illustrate examples of a test-bypass register associated with a memory device and devices for repairing the memory device using the test-bypass register in accordance with one or more implementations.
Figure 2B:
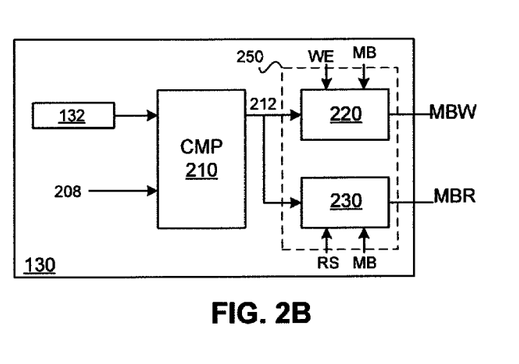
Figure 2C:
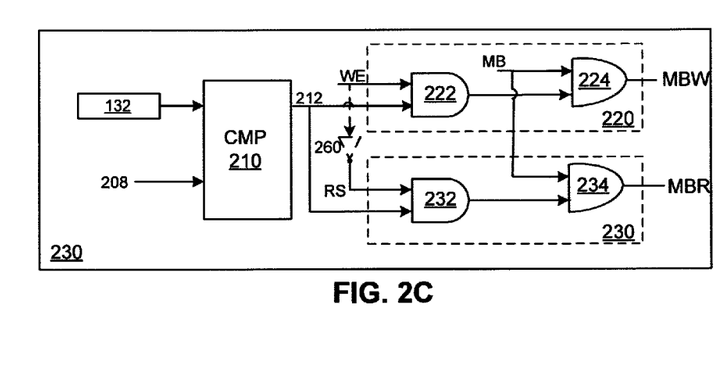

FIGS. 2A-2C illustrate examples of a test-bypass register 222 associated with the memory device 110 of FIG. 1A and devices 130 and 230 for repairing the memory device 110 using the test-bypass register 222 in accordance with one or more implementations of the subject technology. The test-bypass register 222 is similar to the test-bypass register 122 of FIG. 1B, except for a minor change in the mem-bypass input 138 that, in the test-bypass register 222, is divided into mem-bypass inputs 214 and 215. The mem-bypass inputs 214 and 215 are coupled to the multiplexers 140 and 150, respectively. The operation of the test-bypass register 222 is discussed below with respect to the device 230.

FIG. 2B shows the structure of the device 130 according to one or more implementations. The device 130 includes a comparator 210 and a logic block 250. The comparator 210 may be configured to compare a current address 208 with a faulty address 132 and generate a match signal 212, when the current address 208 matches with the faulty address 132. The logic block 250 may generate a first and a second output signal, in response to receiving the match signal 212. The logic block 250, in one or more implementations, may include a first logic circuit 220 and a second logic circuit 230. The first logic circuit 220 may generate the first output signal, which is a memory-bypass-write (MBW) signal, in response to the matched signal 212 and a write-enable (WE) signal or a memory-bypass (MB) signal. The second logic circuit 230 may generate the second output signal, which is a memory-bypass-read (MBR) signal, in response to the matched signal 212 and a read signal RS or the MB signal. The MBW and MBR signals may be coupled to mem-bypass inputs 214 and 215 of FIG. 2A.

In one or more implementations of the subject technology, the device 130 may be realized as the device 230 shown FIG. 2C. The device 230 is similar to the device 130, except that logic circuits 220 and 230 are replaced by logic gates to show the functionality of these circuits. The first logic circuit 220 includes a gate 222 (e.g., an AND gate) and a gate 224 (e.g., an OR gate). Similarly, the second logic circuit 230 includes a gate 232 (e.g., an AND gate) and a gate 234 (e.g., an OR gate). The gates 222 and 224 may operate to assert the MBW signal when the MB signal or both WE signal and the match signal 212 are asserted. When the test-bypass register 222 is operating in the typical test/scan mode, the MB signal is asserted while the WE signal or the match signal 212 may not be asserted. In repair mode, however, both the match signal and the MB signal are asserted and one of the logic circuits 220 and 230 is active (e.g., can control the test-bypass register 222) depending on which of the WE or RS signals are asserted. When the RS signal and the match signal 212 are asserted the output signal of the AND gate 232 is at logical high, which causes the OR gate 234 to assert the MBR signal. In one or more implementations, the RS signal may be replaced by an inverted version of the WE signal generated by an inverter 260 shown by dashed-lines.

In one or more implementation, the MBW signal is applied to the mem-bypass input 214 of the test-bypass register 222 of FIG. 2A and when asserted invokes the multiplexer 140 to pass the input data bit din(j) to the first flip-flop FF1, where the input data bit is stored in the first flip-flop FF1. The MBR signal, on the other hand, is applied to the mem-bypass input 215 of the test-bypass register 222 and when asserted invokes the multiplexer 150 to pass the data bit stored in the first flip-flop FF1 to the output dout (j) of the multiplexer. In other words, the device 230 can use the existing test-bypass registers 222 to repair any number of non-operational cells of the memory device 110, by simply writing to and reading from the first flip-flops FF1 of the test-bypass registers 222, while the memory device 110 is operational.

Figure 3:
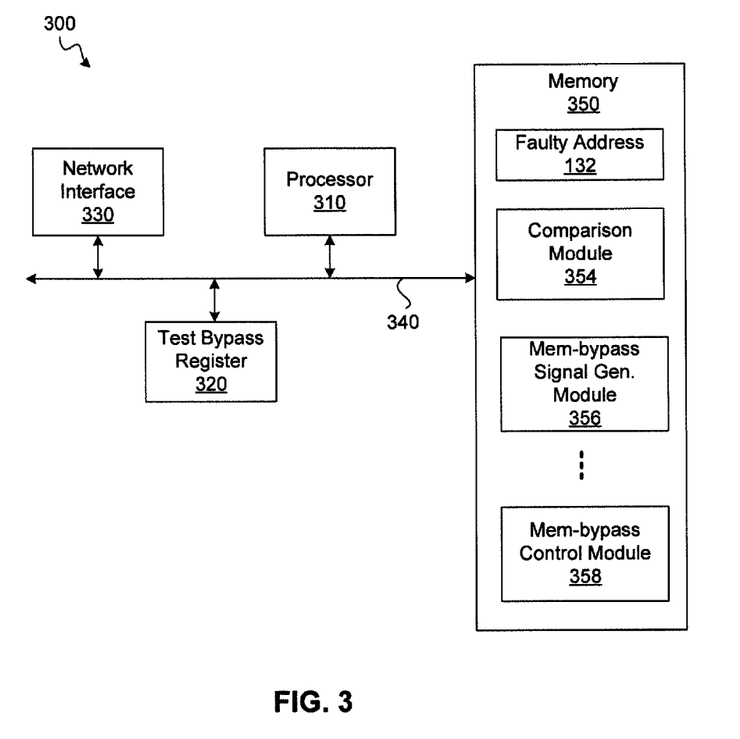
FIG. 3 illustrates an example of a system for repairing a memory device using a test-bypass register in accordance with one or more implementations.

FIG. 3 illustrates an example of a system 300 for repairing a memory device 110 of FIG. 1A using a test-bypass register 320, in accordance with one or more implementations of the subject technology. The system 300 includes, but is not limited to, a processor 310, the test-bypass register 320, a network interface 330, and a memory 350, all coupled to one another through a bus 340. In one or more embodiments, examples of the processor 310 may include a general processor, cores of processors, or other processing units. The test-bypass register 320 may be structurally and functional similar to the test-bypass register 222 of FIG. 2A.

Examples of the memory 350 may include random-access memory (RAM), static RAM (SRAM), dynamic RAM (DRAM), flash memory, and computer readable media. The memory 350 may include, among other data, the faulty address 132 and a number program modules. The program modules may be configured to perform the functionality of the device 130 of FIG. 2A or device 230 of FIG. 2C, when executed by the processor 310.

In one or more implementations, the program modules may include a comparison module 354, a mem-bypass signal generator module 356, and mem-bypass control module 358, which can be executed by the processor 310 to perform the functionalities described below. The comparison module 354 may be configured to compare the faulty address 132 with a current address (e.g., 108 of FIG. 1A) of a memory device (e.g., 110 of FIG. 1A) and generate a match signal when the current address 108 matches the faulty address 132. The mem-bypass signal generator module 356 is configured to respond to the match signal by generating one or more memory bypass signals (e.g., MBW and MBR of FIGS. 2B and 2C.). The mem-bypass control module 358 may be configured to control the operation of the test-bypass register 320 (e.g., test-bypass register 222 of FIG. 2A) to repair a non-operational memory cell of the memory device 110. In one or more implementations, the mem-bypass control module 358 may use the MBW and MBR signals to perform write/read operations associated with the non-operational memory cell on a flip-flop of the test-bypass register 320 (e.g., FF1 of FIG. 2A). The network interface 330 may be configured to couple the system 300 to a network such as a local area network ("LAN"), a wide area network ("WAN"), an Intranet, or a network of networks, such as the Internet.

Figure 4:
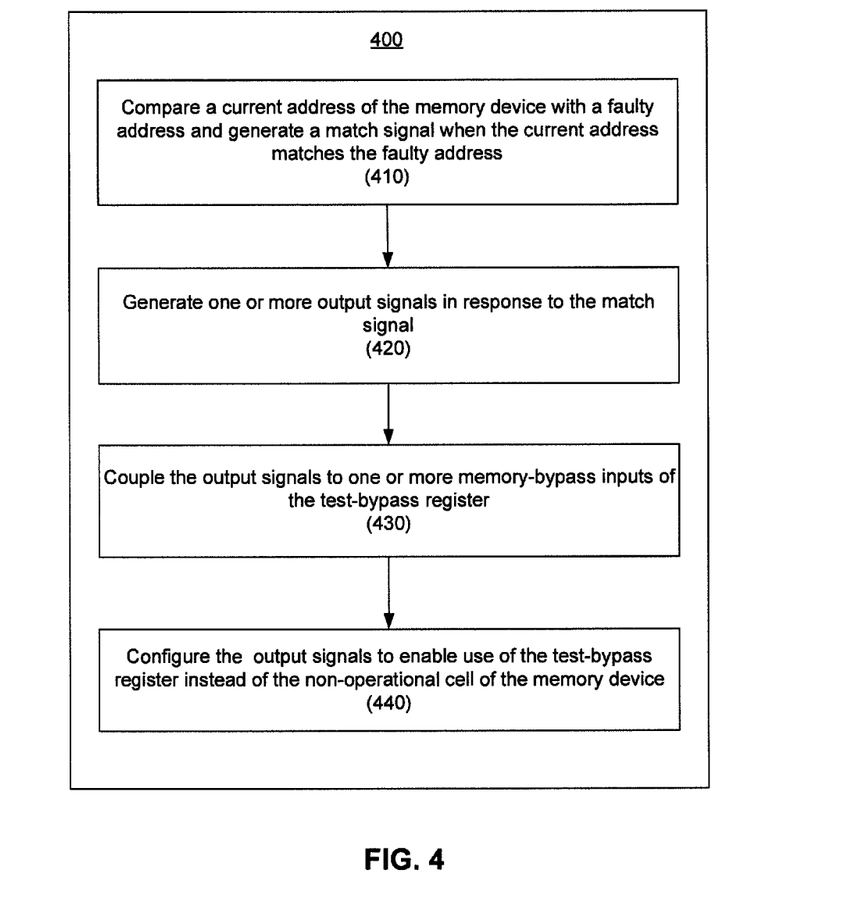
FIG. 4 illustrates an example of a method for repairing a memory device using a test-bypass register in accordance with one or more implementations.

FIG. 4 illustrates an example of a method 400 for repairing a memory device using a test-bypass register in accordance with one or more implementations of the subject technology. The method 400 begins by comparing (e.g., by using 210 of FIG. 2B) a current address (e.g., 208 of FIG. 2B) of the memory device (e.g., 110 of FIG. 1A) with a faulty address (e.g., 132 of FIG. 2B) and generating a match signal (e.g., 212 of FIG. 2B) when the current address matches the faulty address (410). The faulty address may be associated with a non-operational cell of the memory device. One or more output signals (e.g., MBW and MBR of FIG. 2B or FIG. 2C) may be generated in response to the match signal (420). The output signal may be coupled to one or more memory-bypass inputs (e.g., 214 and 215 of FIG. 2A) of the test-bypass register (e.g., 222 of FIG. 2A) (430). The output signals may be configured to enable use of the test-bypass register instead of the non-operational cell of the memory device (440).

Figure 5:
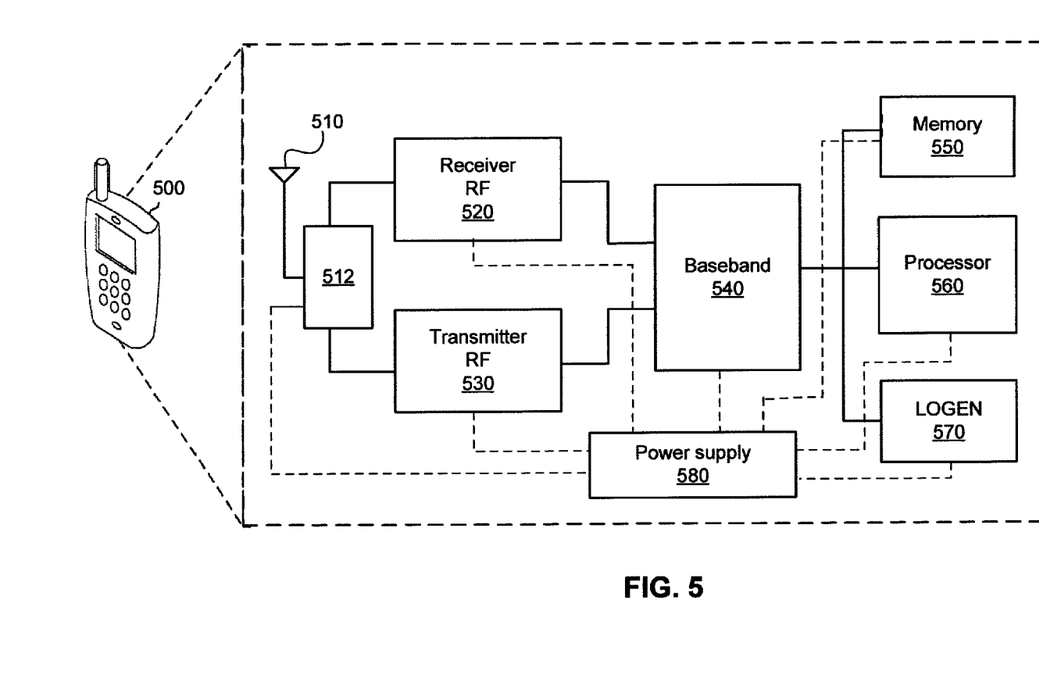
FIG. 5 illustrates an example of a wireless communication device in accordance with one or more implementations.

FIG. 5 illustrates an example wireless communication device 500 in accordance with one or more implementations of the subject technology. The wireless communication device 500 may comprise a radio-frequency (RF) antenna 510, a receiver 520, a transmitter 530, a baseband processing module 540, a memory 550, a processor 560, a local oscillator generator (LOGEN) 570, and a power supply 580. In various embodiments of the subject technology, one or more of the blocks represented in FIG. 5 may be integrated on one or more semiconductor substrates. For example, the blocks 520-570 may be realized in a single chip or a single system on chip, or may be realized in a multi-chip chipset.

The RF antenna 510 may be suitable for transmitting and/or receiving RF signals (e.g., wireless signals) over a wide range of frequencies. Although a single RF antenna 510 is illustrated, the subject technology is not so limited.

The receiver 520 may comprise suitable logic circuitry and/or code that may be operable to receive and process signals from the RF antenna 510. The receiver 520 may, for example, be operable to amplify and/or down-covert received wireless signals. In various embodiments of the subject technology, the receiver 520 may be operable to cancel noise in received signals and may be linear over a wide range of frequencies. In this manner, the receiver 520 may be suitable for receiving signals in accordance with a variety of wireless standards. Wi-Fi, WiMAX, Bluetooth, and various cellular standards.

The transmitter 530 may comprise suitable logic circuitry and/or code that may be operable to process and transmit signals from the RF antenna 510. The transmitter 530 may, for example, be operable to up-convert baseband signals to RF signals and amplify RF signals. In various embodiments of the subject technology, the transmitter 530 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 530 may be operable to provide signals for further amplification by one or more power amplifiers.

The duplexer 512 may provide isolation in the transmit band to avoid saturation of the receiver 520 or damaging parts of the receiver 520, and to relax one or more design requirements of the receiver 520. Furthermore, the duplexer 512 may attenuate the noise in the receive band. The duplexer may be operable in multiple frequency bands of various wireless standards.

The baseband processing module 540 may comprise suitable logic, circuitry, interfaces, and/or code that may be operable to perform processing of baseband signals. The baseband processing module 540 may, for example, analyze received signals and generate control and/or feedback signals for configuring various components of the wireless communication device 500 such as the receiver 520. The baseband processing module 540 may be operable to encode, decode, transcode, modulate, demodulate, encrypt, decrypt, scramble, descramble, and/or otherwise process data in accordance with one or more wireless standards.

The processor 560 may comprise suitable logic, circuitry, and/or code that may enable processing data and/or controlling operations of the wireless communication device 500. In this regard, the processor 560 may be enabled to provide control signals to various other portions of the wireless communication device 500. The processor 560 may also control transfers of data between various portions of the wireless communication device 500. Additionally, the processor 560 may enable implementation of an operating system or otherwise execute code to manage operations of the wireless communication device 500.

The memory 550 may comprise suitable logic, circuitry, and/or code that may enable storage of various types of information such as received data, generated data, code, and/or configuration information. The memory 550 may comprise, for example, RAM, ROM, flash, and/or magnetic storage. In various embodiment of the subject technology, Information stored in the memory 550 may be utilized for configuring the receiver 520 and/or the baseband processing module 540.

In one or more implementations of the subject technology, the memory 550 may include a test-bypass logic (e.g., the test-bypass logic 120 of FIG. 1A) associated with the memory 550. A device (e.g., device 130 of FIG. 1A) included in memory 550 or a number of software modules (e.g., 354, 356, and 358 of FIG. 3) stored, for example, on memory 550 or any other storage medium (e.g., a SD card) of the wireless communication device 500 and executable by the processor 560, may be configured to repair a non-operational cell of the memory 550, using the existing test-bypass logic, as discussed above, while memory 550 is being used.

The local oscillator generator (LOG EN) 570 may comprise suitable logic, circuitry, interfaces, and/or code that may be operable to generate one or more oscillating signals of one or more frequencies. The LOGEN 570 may be operable to generate digital and/or analog signals. In this manner, the LOGEN 570 may be operable to generate one or more clock signals and/or sinusoidal signals. Characteristics of the oscillating signals such as the frequency and duty cycle may be determined based on one or more control signals from, for example, the processor 560 and/or the baseband processing module 540.

In operation, the processor 560 may configure the various components of the wireless communication device 500 based on a wireless standard according to which it is desired to receive signals. Wireless signals may be received via the RF antenna 510 and amplified and down-converted by the receiver 520. The baseband processing module 540 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 550, and/or information affecting and/or enabling operation of the wireless communication device 500. The baseband processing module 540 may modulate, encode and perform other processing on audio, video, and/or control signals to be transmitted by the transmitter 530 in accordance to various wireless standards. The power supply 580 may provide one or more regulated rail voltages (e.g., $V_{DD}$) for various circuitries of the wireless communication device 500.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM. CBRAM, SONOS, RRAM, NRAM, racetrack memory. FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device for repairing a memory device using a test-bypass register associated with the memory device, the device comprising:
   a built-in-self-test (BIST) engine configured to detect a non-operational cell of the memory device being associated with an identified address;
   a comparator configured to compare a current address of the memory device with the identified address and generate a match signal when the current address matches the identified address; and
   a logic block coupled to the comparator and configured to generate at least one output signal in response to the match signal,
   wherein:
   the at least one output signal is coupled to one or more memory-bypass inputs of the test-bypass register, and
   the at least one output signal is configured to enable use of the test-bypass register instead of the non-operational cell of the memory device.

2. The device of claim 1, wherein the memory device comprises single-port memory, dual-port memory, random-access memory (RAM), static RAM (SRAM), dynamic RAM (DRAM), or flash memory, and wherein the device is configured to perform repairing the memory device during operation of the memory device.

3. The device of claim 1, wherein the device is configured to perform repairing the memory device without changing the BIST circuit, wherein the device is further configured to perform an in-field programmable repair of the memory device.

4. The device of claim 1, wherein the at least one output signal is further configured to enable write and read operations into the test-bypass register instead of the non-operational cell of the memory device.

5. The device of claim 1, wherein the logic block comprises a first logic circuit configured to generate a memory-bypass-write signal based on the match signal and a write-enable signal of the memory device.

6. The device of claim 5, wherein the memory-bypass-write signal is configured to enable writing an input data bit into a flip-flop of a corresponding test-bypass register and bypassing the non-operational cell of the memory device.

7. The device of claim 5, wherein the logic block further comprises a second logic circuit configured to generate a memory-bypass-read signal based on the match signal and one of an inverted version of the write-enable signal or a read signal of the memory device.

8. The device of claim 5, wherein:
   the first logic circuit comprises a first AND gate and a first OR gate,
   input nodes of the first AND gate are coupled to the write-enable signal and the match signal, and
   input nodes of the first OR gate are coupled to the memory-bypass signal and an output signal of the first AND gate.

9. The device of claim 7, wherein the memory-bypass-read signal is configured to enable reading an output data bit from the flip-flop of the corresponding test-bypass register and bypassing the non-operational cell of the memory device.

10. The device of claim 7, wherein:
    the second logic circuit comprises a second AND gate and a second OR gate,
    input nodes of the second AND gate are coupled to one of an inverted version of the write-enable signal or a read signal and the match signal, and
    input nodes of the second OR gate are coupled to the memory-bypass signal and an output signal of the second AND gate.

11. A method for repairing a memory device using a test-bypass register associated with the memory device, the method comprising:
    detecting, by using a built-in-self-test (BIST) engine, a non-operational cell of the memory device being associated with an identified address;
    comparing a current address of the memory device with the identified address and generating a match signal when the current address matches the identified address;
    generating at least one output signal in response to the match signal;
    coupling the at least one output signal to one or more memory-bypass inputs of the test-bypass register; and
    configuring the at least one output signal to enable use of the test-bypass register instead of the non-operational cell of the memory device.

12. The method of claim 11, wherein the memory device comprises single-port memory, dual-port memory, random-access memory (RAM), static RAM (SRAM), dynamic RAM (DRAM), or flash memory, and the method further comprises performing repair of the memory device during operation of the memory device.

13. The method of claim 11, further comprising:
    performing repair of the memory device without changing the BIST circuit;
    performing an in-field programmable repair of the memory device; and
    configuring the at least one output signal to enable write and read operations into the test-bypass register instead of the non-operational cell of the memory device.

14. The method of claim 11, wherein generating the at least one output signal comprises using a logic block comprising a first logic circuit, and wherein the method further comprises:

configuring the first logic circuit to generate a memory-bypass-write signal based on the match signal and a write-enable signal of the memory device; and configuring the memory-bypass-write signal to enable writing an input data bit into a flip-flop of a corresponding test-bypass register and bypassing the non-operational cell of the memory device.

15. The method of claim 14, wherein the logic block further comprises a second logic circuit and the method further comprises configuring the second logic circuit to generate a memory-bypass-read signal based on the match signal and one of an inverted version of the write-enable signal or a read signal of the memory device.

16. The method of claim 14, further comprising:
forming the first logic circuit by using a first AND gate and a first OR gate;
coupling input nodes of the first AND gate to the write-enable signal and the match signal; and
coupling input nodes of the first OR gate to the memory-bypass signal and an output signal of the first AND gate.

17. The method of claim 15, further comprising configuring the memory-bypass-read signal to enable reading an output data bit from the flip-flop of the corresponding test-bypass register and bypassing the non-operational cell of the memory device.

18. The method of claim 15, further comprising:
forming the second logic circuit by using a second AND gate and a second OR gate;
coupling input nodes of the second AND gate to one of an inverted version of the write-enable signal or a read signal and the match signal; and
coupling input nodes of the second OR gate to the memory-bypass signal and an output signal of the second AND gate.

19. A system comprising:
memory; and
one or more processors coupled to the memory and configured to execute one or more program modules stored in memory to repair a memory device using a test-bypass register associated with the memory device by performing following operations:
detecting a non-operational cell of the memory device being associated with an identified address;
comparing a current address of the memory device with the identified address and generating a match signal when the current address matches the identified address;
generating at least one output signal in response to the match signal;
applying the at least one output signal to one or more memory-bypass inputs of the test-bypass register; and
configuring the at least one output signal to enable use of the test-bypass register instead of the non-operational cell of the memory device.

20. The system of claim 19, wherein:
repairing the memory device is performed during operation of the memory device,
the repair comprises an in-field programmable repair of the memory device,
the at least one output signal is further configured to enable write and read operations into the test-bypass register instead of the non-operational cell of the memory device, and
the operations further comprise:
generating a memory-bypass-write signal based on the match signal and a write-enable signal of the memory device that enables writing an input data bit into a flip-flop of a corresponding test-bypass register and bypassing the non-operational cell of the memory device; and
generating a memory-bypass-read signal based on the match signal and one of an inverted version of the write-enable signal or a read signal of the memory device.

* * * * *